US010647016B2

(12) United States Patent
Crudo et al.

(10) Patent No.: US 10,647,016 B2
(45) Date of Patent: May 12, 2020

(54) INTERCHANGEABLE SPRING PACK FOR AN UPPER DIE IN A LEAD FORMING SYSTEM

(71) Applicant: Fancort Industries, Inc., West Caldwell, NJ (US)

(72) Inventors: Alex Crudo, Raritan, NJ (US); Ryan C. Blesi, Melville, NY (US); Robert G. Antonelli, Matawan, NJ (US); William M. Carpenter, Kenilworth, NJ (US)

(73) Assignee: Fancort Industries, Inc., West Caldwell, NJ (US)

( * ) Notice: Subject to any disclaimer, the term of this patent is extended or adjusted under 35 U.S.C. 154(b) by 313 days.

(21) Appl. No.: 15/804,667

(22) Filed: Nov. 6, 2017

(65) Prior Publication Data

US 2019/0134842 A1 May 9, 2019

(51) Int. Cl.
*B26F 1/14* (2006.01)
*H05K 13/00* (2006.01)
*H01L 21/67* (2006.01)
*B26F 1/44* (2006.01)
*H01L 21/48* (2006.01)

(52) U.S. Cl.
CPC .............. *B26F 1/14* (2013.01); *B26F 1/44* (2013.01); *H01L 21/67092* (2013.01); *H05K 13/0092* (2013.01); *B26F 2001/4427* (2013.01); *B26F 2001/4463* (2013.01); *H01L 21/4842* (2013.01)

(58) Field of Classification Search
CPC ...... B26F 1/14; B26F 1/44; B26F 2001/4427; B26F 2001/4463; H01L 21/67092; H01L 21/4842; H05K 13/0092; H05K 13/023; H05K 13/0061; H05K 13/0069; Y10T 29/515

USPC ............... 29/566.3, 34 D; 72/294; 140/105
See application file for complete search history.

(56) References Cited

U.S. PATENT DOCUMENTS

| | | | |
|---|---|---|---|
| 3,769,823 A | 11/1973 | Greeninger | |
| 3,796,201 A | 3/1974 | Golub | |
| 3,903,934 A * | 9/1975 | Vizy | H05K 13/023 140/105 |
| 4,907,628 A | 3/1990 | Corey et al. | |
| 5,025,691 A * | 6/1991 | Deni | B21D 28/34 83/140 |
| 5,078,186 A | 1/1992 | Togashi et al. | |
| 5,105,857 A | 4/1992 | Ellis | |

(Continued)

FOREIGN PATENT DOCUMENTS

JP S63108919 U 5/1988

*Primary Examiner* — Gregory D Swiatocha
(74) *Attorney, Agent, or Firm* — Werschulz Patent Law, LLC; Patricia P. Werschulz, Esq.

(57) ABSTRACT

An improvement to a lead forming system that provides quick changeover without complete disassembly. By removing a pair of fasteners securing a pair of die inserts, a spring pack in an upper die unit can be freely rotated and interchanged or modified. The spring pack has a plurality of chamfers that allow the spring pack to rotate within the die pack until a narrower side is presented for removal. Straightforward access to the cutting units is afforded when the spring pack is removed. Risk of damage to various components of the lead forming system is minimized and the precision and accuracy of the new setup is increased because the system was minimally disassembled. A method for removing the spring pack in the upper die unit is fully disclosed.

8 Claims, 7 Drawing Sheets

(56) References Cited

U.S. PATENT DOCUMENTS

| | | |
|---|---|---|
| 5,222,528 A | 6/1993 | Downing |
| 5,410,804 A | 5/1995 | Berendts |
| 5,467,803 A * | 11/1995 | Yoshimura ......... H05K 13/0092 |
| | | 140/105 |
| 5,806,571 A | 9/1998 | Minami |
| 8,196,445 B2 | 6/2012 | Kumamoto |
| 2009/0093086 A1 | 4/2009 | Kumamoto |

* cited by examiner

INTERCHANGEABLE SPRING PACK FOR AN UPPER DIE IN A LEAD FORMING SYSTEM

TECHNICAL FIELD

The present invention relates to a system for forming offset leads of an electronic component, and in particular, to an improvement of a system for forming leads of a gullwing configuration of an SMT (surface mount technology) electronic component and method of operation thereof.

BACKGROUND

Many electronic components have a functional body portion that connects to a circuit board or other components by a plurality of leads. Initially these leads are in plane extending horizontally outward from the body portion. In the final step before connecting within an electronic device, the planar leads are formed into a gullwing configuration. The leads are trimmed to a uniform length.

These electronic components often have leads that extend both along an X-axis and along a Y-axis and are often referred to as "quad packs" because there are four sets of leads to attach to a printed circuit board; electronic components that have leads on two sides of a device are referred to as flat packs.

The gullwing shape of the leads has an upper horizontal portion extending from the body portion, a lower foot portion, upon which the electronic component will rest when joined to the circuit surface, and an intermediate transverse portion. The vertical distance of the intermediate transverse portion between the plane of the foot portion and the bottom surface of the body portion of the component is a critical dimension in the formation of these leads.

Machines are available to form the leads of the electronic component into the desired gullwing configuration while insuring the required length of the transverse portions is constant. For example, a lower floating anvil and complementary upper die unit accomplishes the requirements without having to measure the required distances. Using sensing components, the leads are bent and trimmed to produce the desired vertical distance between foot portion of the lead and the bottom surface of the body of the component.

Generally, these machines are set-up for particular dimensions and lead types and then disassembled and reassembled with different parts to produce components with different dimensions and lead types. The process of disassembly and reassembly is time consuming and limits flexibility in the manufacturing process for these components.

While these systems may be suitable for the particular purpose employed, or for general use, they would not be as advantageous for the purposes of the present disclosure as disclosed hereafter.

In the present disclosure, where a document, act or item of knowledge is referred to or discussed, this reference or discussion is not an admission that the document, act or item of knowledge or any combination thereof was at the priority date, publicly available, known to the public, part of common general knowledge or otherwise constitutes prior art under the applicable statutory provisions; or is known to be relevant to an attempt to solve any problem with which the present disclosure is concerned.

While certain aspects of conventional technologies have been discussed to facilitate the present disclosure, no technical aspects are disclaimed and it is contemplated that the claims may encompass one or more of the conventional technical aspects discussed herein.

BRIEF SUMMARY

An aspect of an example embodiment in the present disclosure is to provide an improved lead forming system having a component that is easily modifiable or interchangeable. Accordingly, the present disclosure provides a spring pack in an upper die unit that is removable without disassembly of lead forming system.

Another aspect of an example embodiment in the present disclosure is to provide an improved lead forming system that is quick to changeover. Accordingly, the present disclosure provides a spring pack that is secured in cooperation with a pair of die inserts that are easily removed by unscrewing a pair of fasteners.

A further aspect of an example embodiment in the present disclosure is to provide an improved lead forming system having a spring pack that is selectively removable for easy modification or replacement. Accordingly, the present disclosure provides a spring pack with a plurality of chamfers that allow the spring pack to rotate within an upper die unit of the lead forming system, allowing the spring pack to be removed when the narrow dimension presents outwardly.

Accordingly, the present disclosure describes an improvement to a lead forming system that provides quick changeover without complete disassembly. By removing a pair of fasteners securing a pair of die inserts, a spring pack in an upper die unit can be freely rotated and interchanged or modified. The spring pack has a plurality of chamfers that allow the spring pack to rotate within the die pack until a narrower side is presented for removal. Straightforward access to the cutting units is afforded when the spring pack is removed. Risk of damage to various components of the lead forming system is minimized and the precision and accuracy of the new setup is increased because the system was minimally disassembled. A method for removing the spring pack in the upper die unit is fully disclosed.

The present disclosure addresses at least one of the disadvantages of the prior art. However, it is contemplated that the present disclosure may prove useful in addressing other problems and deficiencies in a number of technical areas. Therefore, the claims should not necessarily be construed as limited to addressing any of the particular problems or deficiencies discussed hereinabove. To the accomplishment of the above, this disclosure may be embodied in the form illustrated in the accompanying drawings. Attention is called to the fact, however, that the drawings are illustrative only. Variations are contemplated as being part of the disclosure.

BRIEF DESCRIPTION OF THE DRAWINGS

In the drawings, like elements are depicted by like reference numerals. The drawings are briefly described as follows.

The present disclosure now will be described more fully hereinafter with reference to the accompanying drawings, which show various example embodiments. However, the present disclosure may be embodied in many different forms and should not be construed as limited to the example embodiments set forth herein. Rather, these example embodiments are provided so that the present disclosure is thorough, complete and fully conveys the scope of the present disclosure to those skilled in the art.

DETAILED DESCRIPTION OF THE PREFERRED EMBODIMENTS

Figure 1:
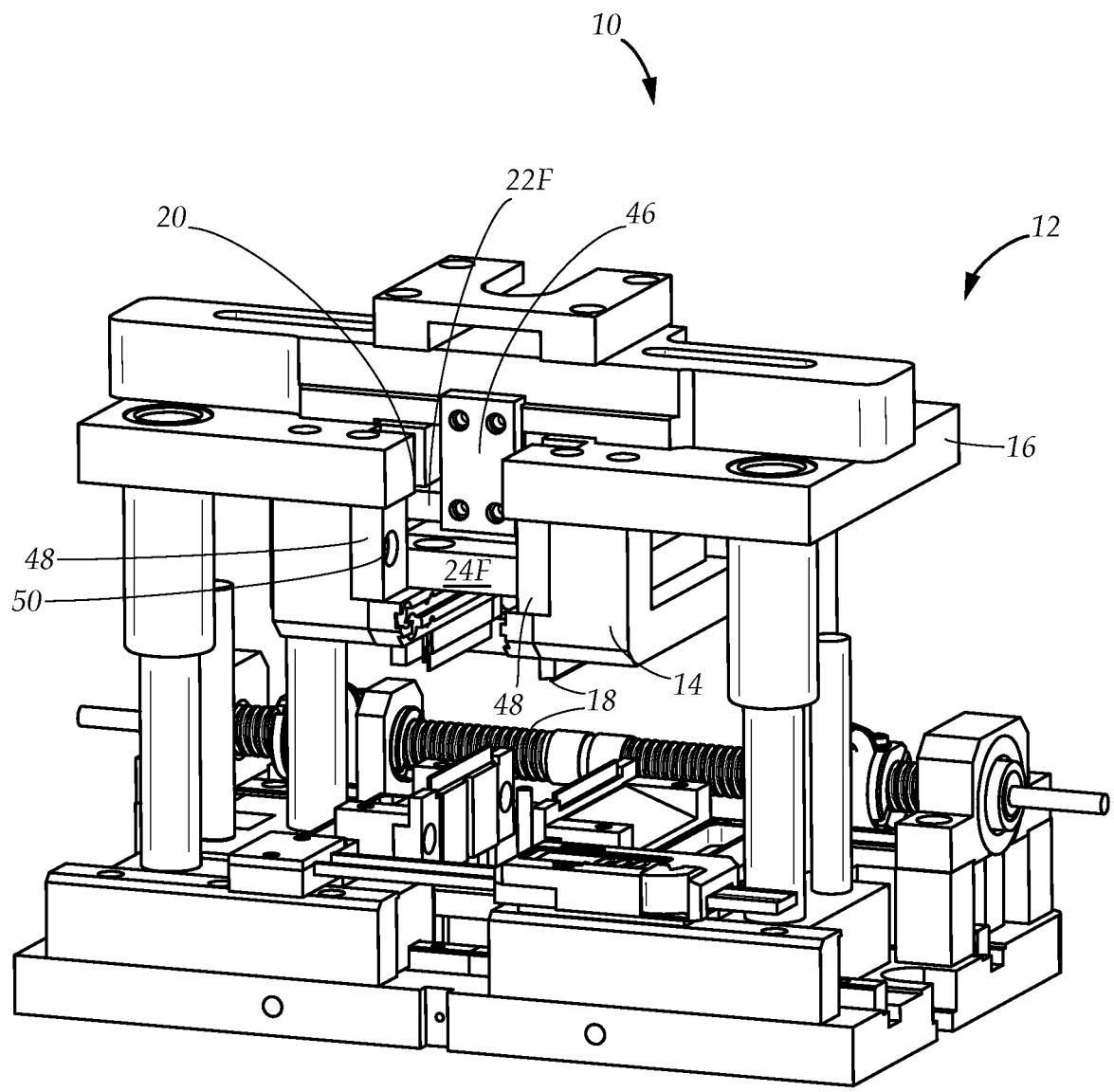
FIG. 1 is a perspective view of an example embodiment of a lead forming system.

FIG. 1 illustrates a lead forming system 10 for forming gullwing leads on an SMT (surface mount technology) electronic component. The basic structure and function of the lead forming system is described in the prior art and disclosed in U.S. Pat. No. 4,907,628, which is incorporated by reference in its entirety.

As disclosed in the prior art, the lead forming system includes a lower floating anvil and complementary upper die unit 12 having clamping and forming surfaces defining a gullwing shaped joint therein between. The clamping surfaces are moveable relative to the forming surfaces and the degree of this movement which is permitted is controlled by sensors responsive to contact with the body of the electronic component. These sensors are set to produce the desired vertical distance between foot portion of the lead and the bottom surface of the body of the component.

Herein is disclosed an improvement to the lead forming system 10 that allows for a rapid changeover of key components in the system without total disassembly, thereby reducing setup time for a changeover. The advantages of the improvement are numerous including minimizing the risk of damage to parts, easier access to other components in the system and increase in accuracy and precision of the system.

The lead forming system has the upper die unit 12 that includes, a die top 14, an upper die shoe 16 and a plurality of cutting units 18. Within the upper die top 14, there is a spring pack 20 engaging the cutting units 18 during the forming and cutting of the gullwing leads of the electronic component. There is a pair of selectively removable die top inserts 48 securing the spring pack 20 within the upper die unit 12 of the lead forming system 10. Each die top insert is held in place by a fastener 50.

Figure 2:
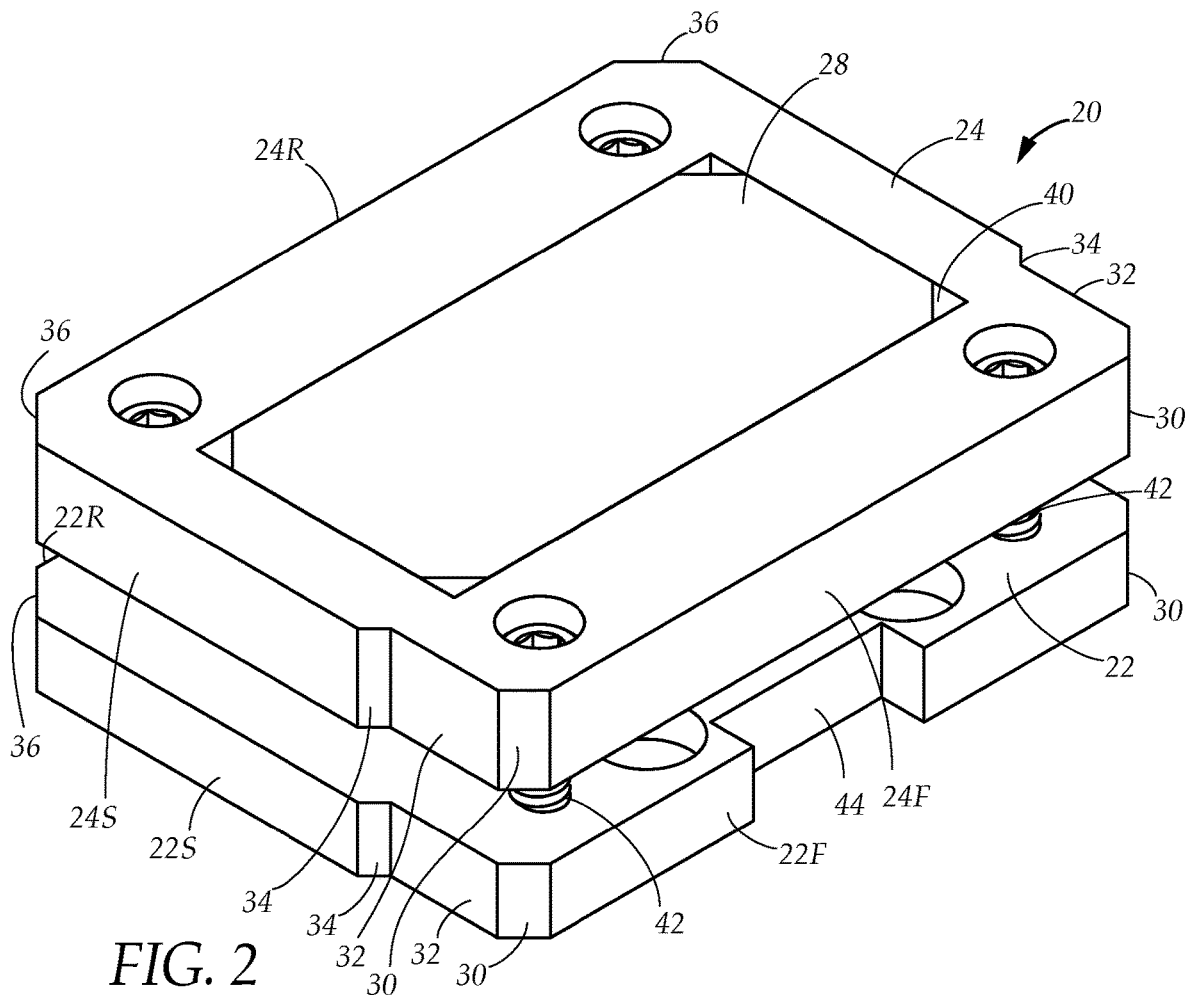
FIG. 2 is a perspective view of an example embodiment of an interchangeable spring pack for an upper die in a lead forming system.
Figure 3:
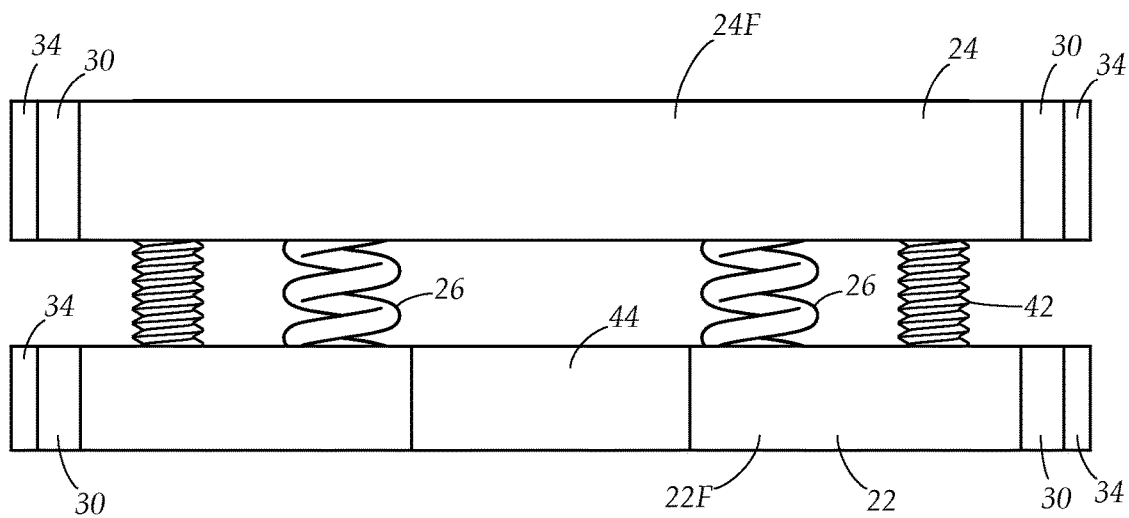
FIG. 3 is a front elevational view of the example embodiment of the interchangeable spring pack.

FIGS. 2 and 3 illustrate an example embodiment of the novel spring pack 20 that is placed in the upper die unit 12 of FIG. 1. The illustrations are inverted to better show the features of the bottom of the spring pack 20. The spring pack 20 has a top member 22 coupled to a bottom member 24. The bottom member 24 has a center opening 40 with a pressure plate 28 conforming to the center opening. The top member 22, bottom member 24 and the pressure plate 28 therein define the spring pack exterior.

The top member 22 has a front 22F, a rear 22R and a pair of sides 22S. The bottom member 24 has a front 24F, a rear 22R and a pair of sides 22S, the bottom member coupled to the top member by a plurality of fasteners 42. The spring pack has a front defined by the front 22F of the top member 22 and the front 24F of the bottom member 24 along with the rear 22R and the rear 24R of the top member 22 and bottom member 24 respectively. The spring pack 20 is essentially rectangular having the sides 22S of the top member 22 and the sides 24S of the bottom member 24 shorter than the front of the spring pack.

The spring pack 20 has a plurality of chamfered corners forming chamfers on the top member 22 and the bottom member 24, the chamfers of the top member the mirror of the chamfers of the bottom member.

The spring pack 20 has two pairs of rear chamfers 36, a first pair on the top member 22 and a second pair on the bottom member 24.

The spring pack 20 has two pairs of front chamfers 30, a first pair on the top member 22 and a second pair on the bottom member 24, the front chamfers 30 extending to a plurality of grooves 32 on the sides 22S of the top member 22 and the sides 24S of the bottom member 24, each groove terminating in a bevel 34 connecting to the sides 24S of the bottom member 24 and to the sides 22S of the top member 22, the chamfers, the grooves and the bevels of the top member the mirror of the bottom member The spring pack 20 has a plurality of springs 26 between the top member 22 and the pressure plate 28 configured for allowing deflection of the pressure plate within the center opening 40 of the bottom member 24.

The fasteners 42 define a position of the top member 22 relative to the bottom member 24. The fasteners 42 are configured for modifying spring tension within the pressure plate 28, by allowing the spring pack 20 to be easily disassembled and a different set of springs 26 to be placed between the top member 22 and the bottom member 24.

The spring pack 20 has a front cutout 44 configured for receiving a lifter 46 shown in FIG. 1. The die top inserts 48 cooperate with the front side 24S of the bottom member 24 and with a front side 22F of the top member 22.

FIGS. 4-8 illustrate a method of interchanging and modifying the spring pack 20 in an upper die unit 12 of a lead forming system 10.

Figure 4:
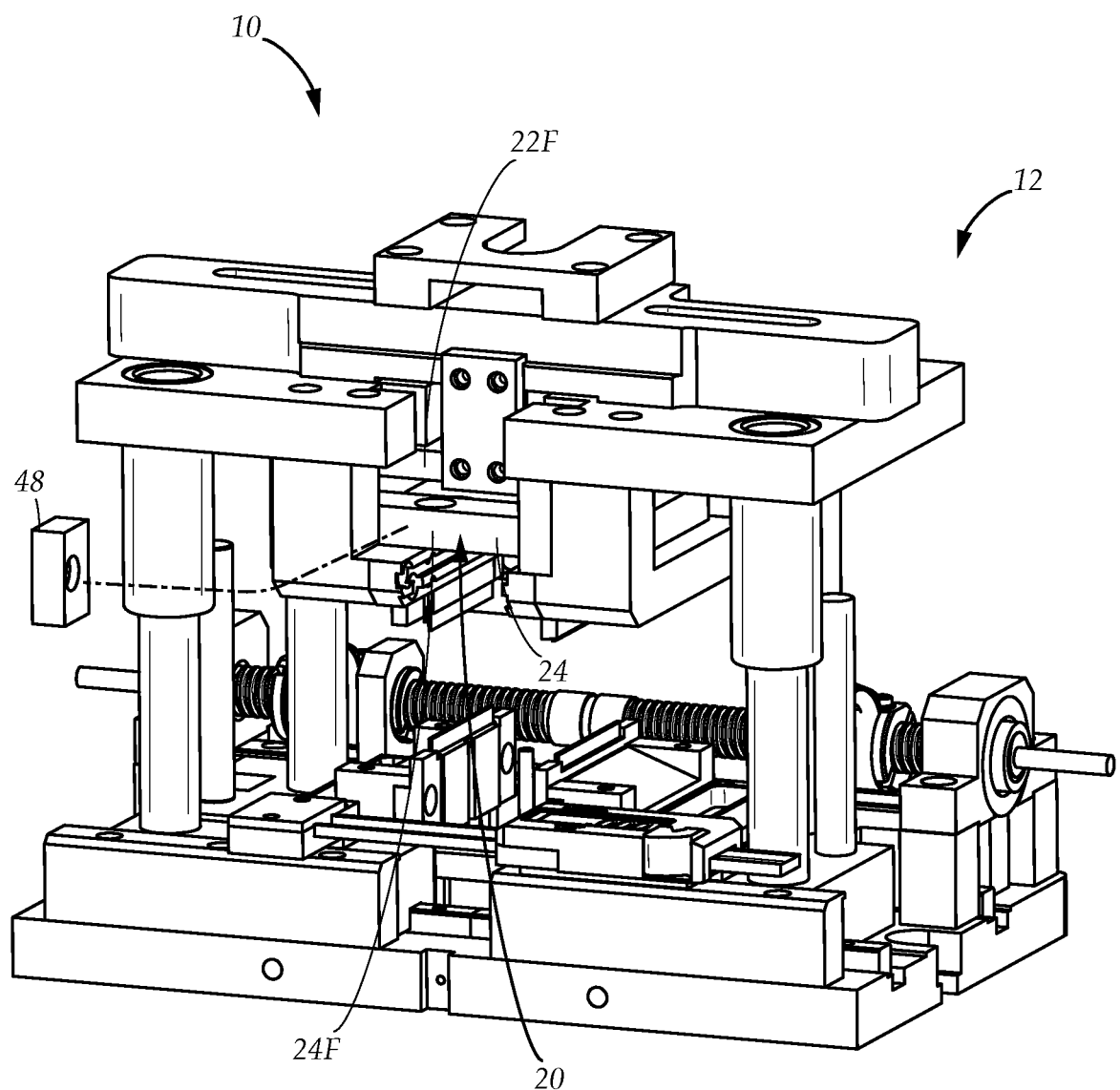
FIG. 4 is a perspective view of an initial step of a method of changing the example embodiment of the interchangeable spring pack in the lead forming system.
Figure 5:
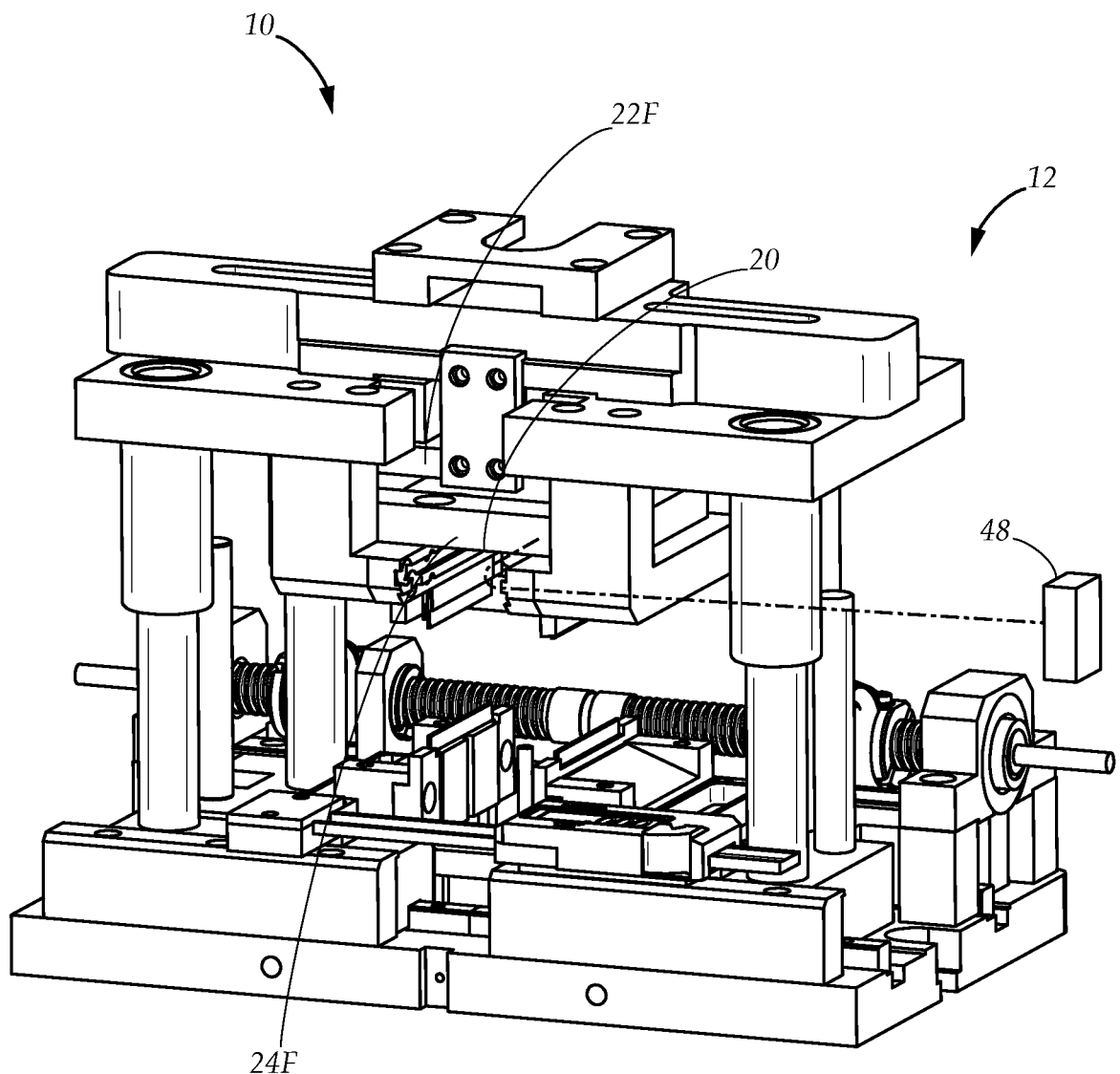
FIG. 5 is a perspective view of a subsequent step of the method of changing the example embodiment of the interchangeable spring pack in the lead forming system.

In FIG. 4 and FIG. 5, the die top inserts 48 are removed from the front 22F of a top member of the spring pack 20 and the front 24F of the bottom member 24 of the spring pack in the upper die unit 12 of the lead forming system 10. This is easily accomplished by removing the fasteners 50 holding the die top inserts 48 in place.

Figure 6:
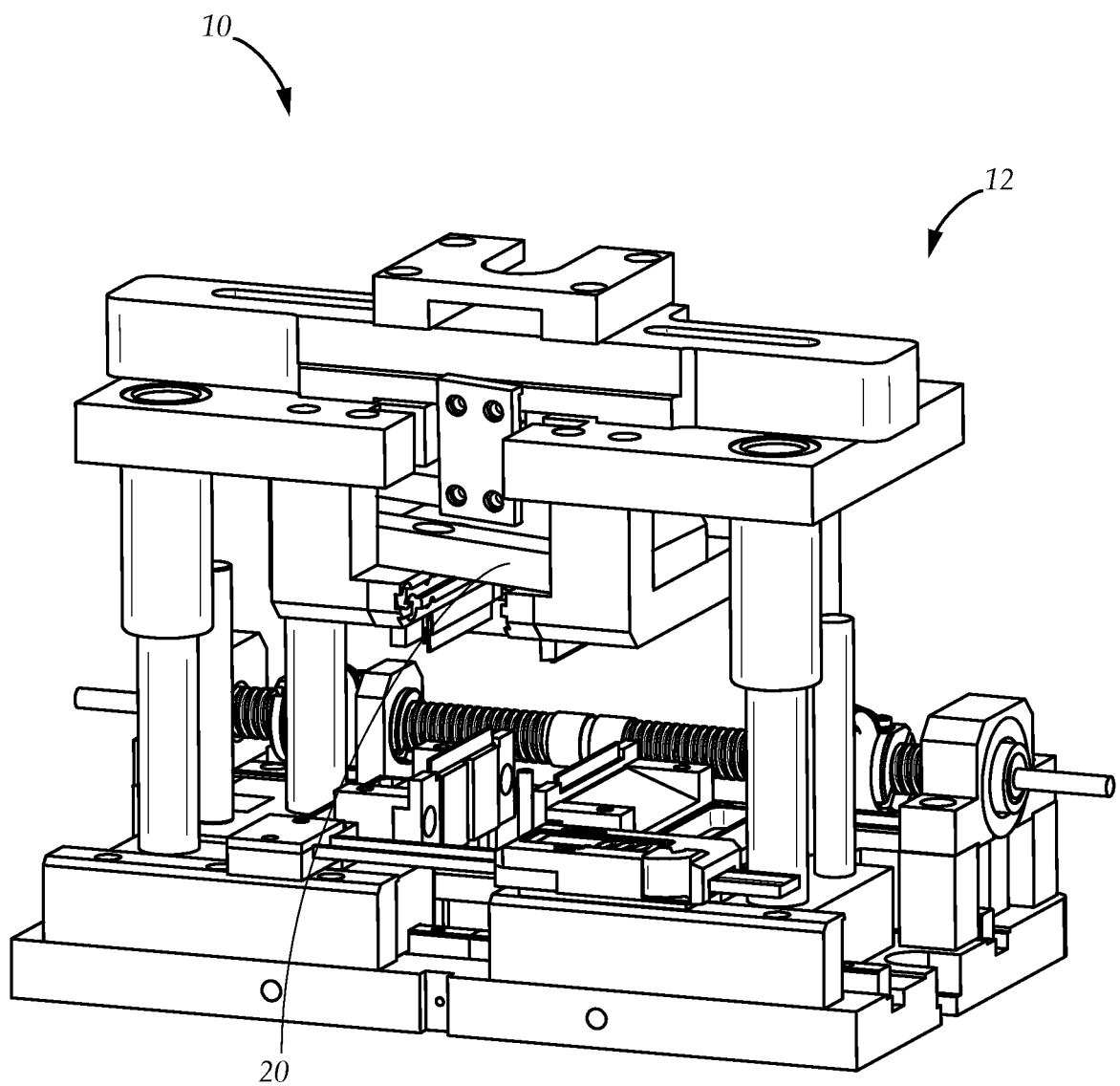
FIG. 6 is a perspective view of an initial rotational step of the method of changing the example embodiment of the interchangeable spring pack in the lead forming system.
Figure 7:
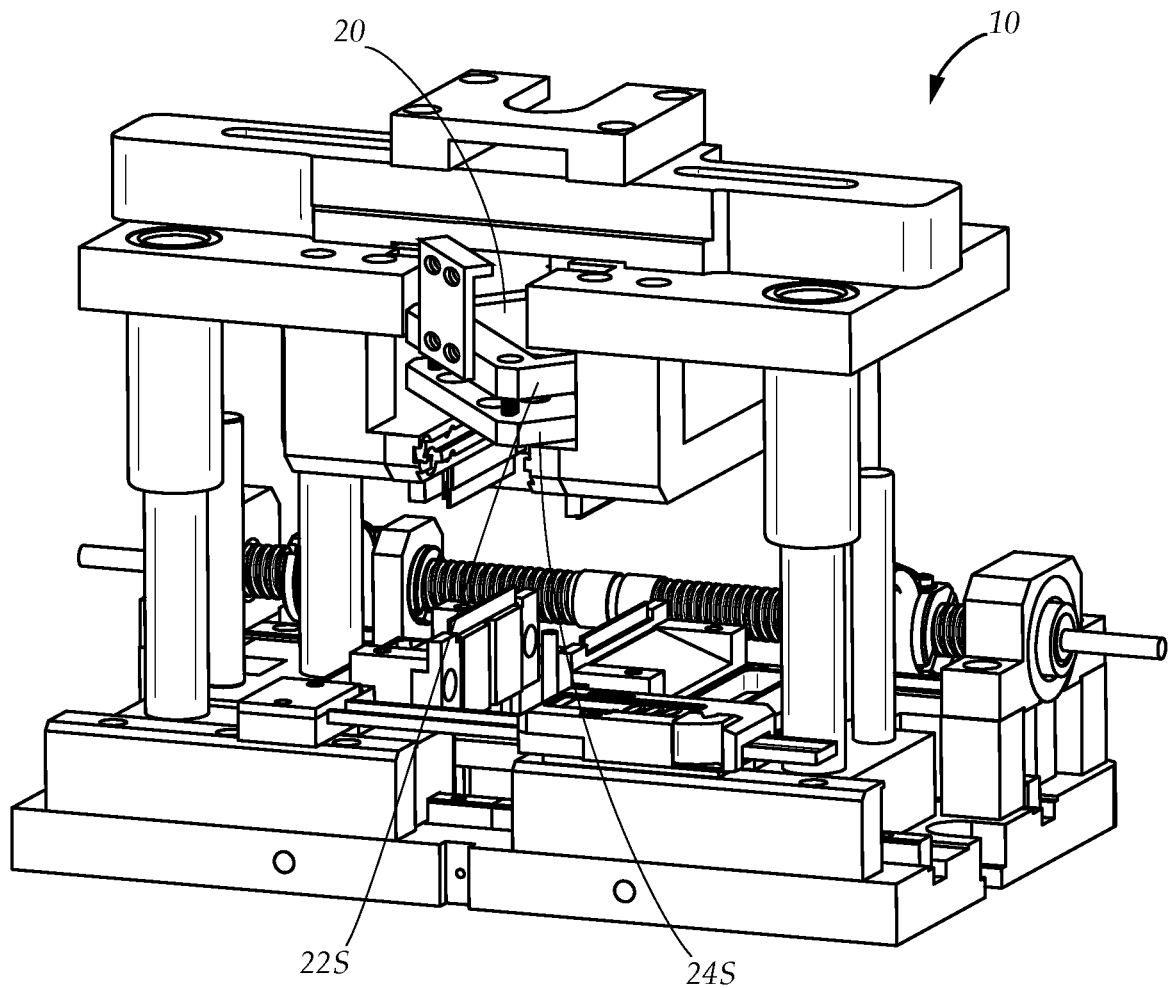
FIG. 7 is a perspective view of a rotational step of the method of changing the example embodiment of the interchangeable spring pack in the lead forming system.

In FIG. 6 and FIG. 7, the spring pack 20 is pulled forward and rotates within the die unit 12 until the sides 22S and 24S of the spring pack 20 is in a forward position.

Figure 8:
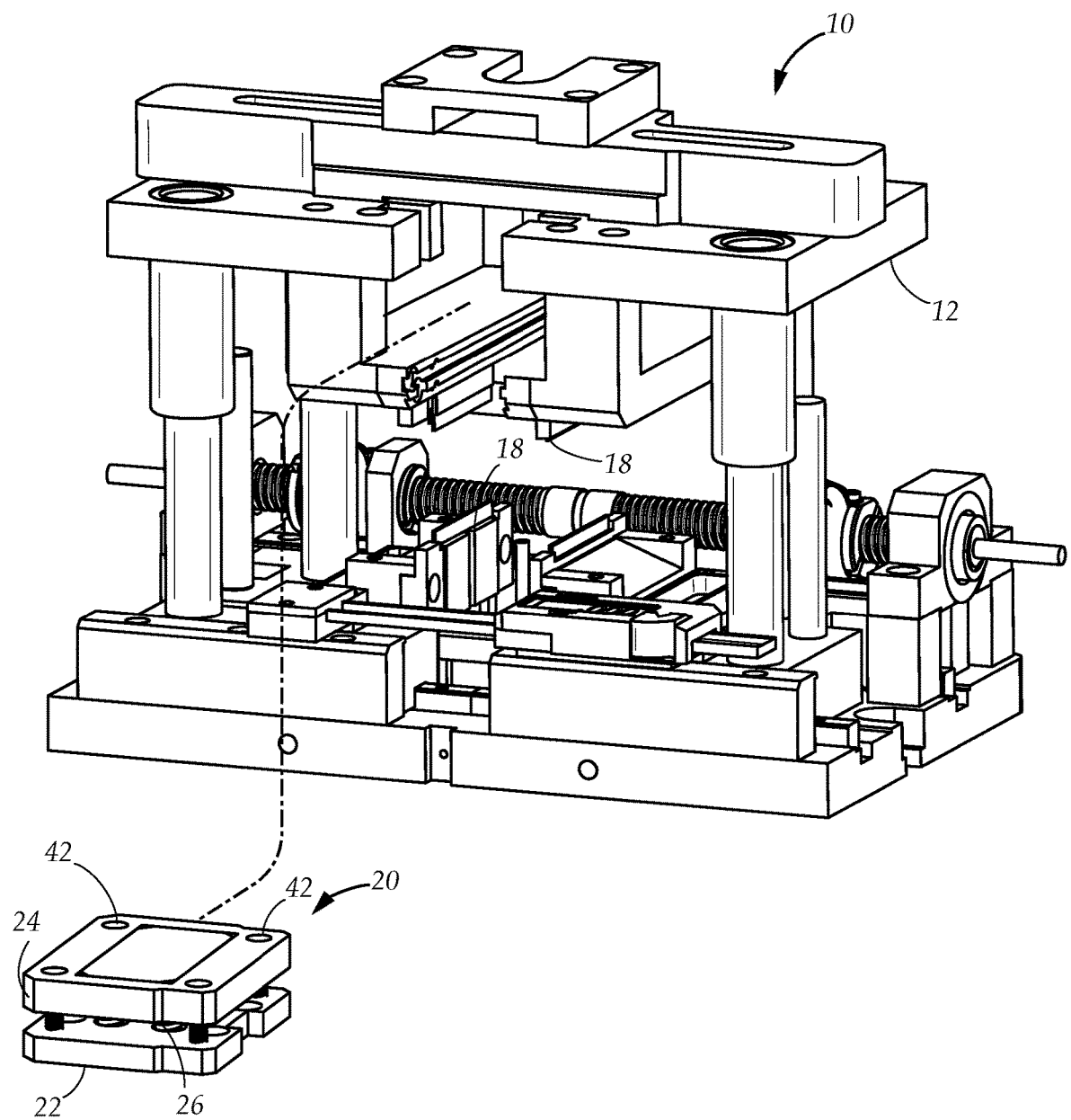
FIG. 8 is a perspective view of a removal step of the method of changing the example embodiment of the interchangeable spring pack in the lead forming system.

In FIG. 8, once the sides 22S and 24S are completely forward facing, the sides shorter than the front and back of the spring pack 20, the spring pack 20 is removed by pulling the spring pack straightforwardly from the upper die unit 12. Note in the drawing, the spring pack 20 in an inverted position after removal.

To replace the spring pack 20 in the upper die unit, either after modifying the spring pack 20 with a different set of springs or replacing the first spring pack with a second spring pack, the previous steps described hereinabove are reversed. The springs 26 are replaced by a different set of springs by removing the fasteners, separating the top member 22 from the bottom member 24 and removing a first set of springs and replacing with a second set of springs.

As described hereinabove, referring to FIGS. 1-8, the spring pack 20 has two pairs of chamfers, a rear pair of chamfers 36 and a front pair of chamfers 30 on each member 22, 24, the front chamfers 30 connecting to the side groove 32 that tapers to the bevels 34, and the spring pack 20 rotates within the upper die unit 12 by pivoting on the chamfers 30, 36 and the bevels 34. The spring pack 20 pivots on one mirror pair of the front chamfers 30 and one mirror pair of rear chamfers 36 diagonally from the pivoting front chamfers, slides along the grooves 32 and pivots on the bevels 34 until the sides 22S, 24S are front-facing.

As one of ordinary skill in the art can recognize, once the spring pack is removed, access to other members of lead forming system 10 are more accessible if replacement or adjustment is required. Regarding a plurality of bottom cutting units 18, in another example embodiment, a universal ratchet increases the ease of removal.

In one example embodiment, the lead forming system is controlled by a PLC (programmable logic controller). The PLC is operationally controlled with data input for the particular quad pack. The PLC sets the standoff height for the particular quad pack operationally through a motor and not by a manual micrometer. All set up and calibration is performed and verified through the PLC.

It is understood that when an element is referred hereinabove as being "on" another element, it can be directly on the other element or intervening elements may be present therebetween. In contrast, when an element is referred to as being "directly on" another element, there are no intervening elements present.

Moreover, any components or materials can be formed from a same, structurally continuous piece or separately fabricated and connected.

It is further understood that, although ordinal terms, such as, "first," "second," "third," are used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Spatially relative terms, such as "beneath," "below," "lower," "above," "upper" and the like, are used herein for ease of description to describe one element or feature's relationship to another element(s) or feature(s) as illustrated in the figures. It is understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device can be otherwise oriented (rotated 90 degrees or at other orientations) and the spatially relative descriptors used herein interpreted accordingly.

Example embodiments are described herein with reference to cross section illustrations that are schematic illustrations of idealized embodiments. As such, variations from the shapes of the illustrations as a result, for example, of manufacturing techniques and/or tolerances, are to be expected. Thus, example embodiments described herein should not be construed as limited to the particular shapes of regions as illustrated herein, but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In conclusion, herein is presented an improvement to the lead forming system. The disclosure is illustrated by example in the drawing figures, and throughout the written description. It should be understood that numerous variations are possible, while adhering to the inventive concept. Such variations are contemplated as being a part of the present disclosure.

What is claimed is:

1. A system in a lead forming device, comprising:
   an upper die unit; and
   a removable spring pack, the removable spring pack further comprising:
      a top member coupled to a bottom member, the bottom member having a center opening with a pressure plate to within the center opening such that the pressure plate substantially covers the center opening of the bottom member, the top member, the bottom member and the pressure plate therein defining a removable spring pack exterior;
      a plurality of chamfers on the removable spring pack exterior;
      a plurality of springs between the top member and the pressure plate configured for allowing deflection of the pressure plate within the center opening of the bottom member,
   whereas the removable spring pack is removable from the upper die unit in the system.

2. The system as described in claim 1, wherein the bottom member of the removable spring pack is coupled to the top member of the removable spring pack by a plurality of fasteners.

3. The system as described in claim 2, further comprising a pair of removable die top inserts securing the removable spring pack within the upper die unit of the lead forming system.

4. The system as described in claim 3, wherein the pair of removable die top inserts cooperates with the front of the bottom member of the removable spring pack and with the front of the top member of the removable spring pack.

5. The system as described in claim 4, wherein the top member has a cutout in a front portion of the top member of the removable spring pack, the cutout configured for receiving a top lifter.

6. A spring pack in an upper die unit of a lead forming system, comprising:
   a top member having a front, a rear and a pair of sides;
   a bottom member having a center opening, a front, a rear and a pair of sides, the bottom member coupled to the top member by a plurality of fasteners;
   two pairs of rear chamfers, a first pair on the top member and a second pair on the bottom member, the rear chamfers of the top member being the mirror image of the rear chamfers of the bottom member,
   two pairs of front chamfers, a first pair on the top member and a second pair on the bottom member, the front chamfers extending to a plurality of grooves on the sides of the top member and the sides of the bottom member, each groove terminating in a bevel connecting to the sides of the bottom member and to the sides of the top member, the front chamfers, the grooves and the bevels of the top member being the mirror image of the front chamfers, the grooves and the bevels of the bottom member;

a pressure plate conforming to the center opening in the bottom member such that the pressure plate substantially covers the center opening of the bottom member; and a plurality of springs between the top member and the pressure plate configured for allowing deflection of the pressure plate within the center opening of the bottom member.

7. The spring pack as described in claim 6, wherein the top member has a cutout in the front of the top member, the cutout configured for receiving a top lifter.

8. The spring pack as described in claim 7, further comprising a pair of die top inserts cooperating with the front of the bottom member and with the front of the top member, securing the spring pack in the upper die unit of the lead forming system.

\* \* \* \* \*